United States Patent [19]

Cole et al.

[11] Patent Number: 4,549,118
[45] Date of Patent: Oct. 22, 1985

[54] STEP WAVEFORM GENERATOR AND CRT VERTICAL TIMEBASE INCORPORATING SUCH A GENERATOR

[75] Inventors: Terence G. Cole; Roderick M. West, both of Southampton, England

[73] Assignee: International Business Machines Corporation, Armonk, N.Y.

[21] Appl. No.: 595,127

[22] Filed: Mar. 30, 1984

[30] Foreign Application Priority Data

Apr. 29, 1983 [EP] European Pat. Off. ........ 83302444.1

[51] Int. Cl.$^4$ ............................................. H01J 29/72
[52] U.S. Cl. ................................... 315/393; 315/408; 328/186
[58] Field of Search ............... 315/399, 408, 403, 393, 315/395; 328/183, 186, 187

[56] References Cited

U.S. PATENT DOCUMENTS

| | | |
|---|---|---|
| 3,111,591 | 11/1963 | Conron et al. |
| 3,662,102 | 5/1972 | Herndon . |
| 3,749,938 | 7/1973 | Van Winkler ..................... 328/186 |
| 4,078,252 | 3/1978 | Schoenfeld et al. . |
| 4,227,117 | 10/1980 | Watanabe et al. ................. 315/13.1 |

OTHER PUBLICATIONS

Elektronik, vol. 22, No. 4, Apr. 1973, pp. 139–142 Munich, Germany. G. Harms: "Ein vielseitig verwendbarer Kennlinienschreiber".

Primary Examiner—Theodore M. Blum
Attorney, Agent, or Firm—Frederick D. Poag

[57] ABSTRACT

A step waveform generator includes a cup and bucket circuit in which charging and discharging a cup capacitor (C1) with predetermined units of charge is achieved, in response to a train of pulses supplied to its input terminal (1), by means of an operational amplifier (2) continuously monitoring the voltage across the cup capacitor and alternately supplying charging current and discharging current from a first and second constant current source (I1 and I2) respectively via separate feedback loops (T3, T2 and T4, T7, T6) of the amplifier. The constant currents, or multiples or sub-multiples of the constant currents, providing each individual unit of charge, are generated by current mirrors (T8, T9, T10) and added sequentially to a bucket capacitor C2. The size of each individual step of the resultant voltage waveform derived from the bucket capacitor and appearing at output terminal 4 depends upon the combination of mirrored increments of current selected by switch (S1, S2) and added to the bucket capacitor. The waveform generator is particularly useful when driven by CRT horizontal sync pulses to provide a vertical timebase circuit generating a stepped voltage waveform instead of the more customary ramp voltage waveform. Appropriate combination of the outputs of the mirrors by judicious operation of the switches S1, S2 controls field interlace and single and multiple line skips.

5 Claims, 2 Drawing Figures

STEP WAVEFORM GENERATOR AND CRT VERTICAL TIMEBASE INCORPORATING SUCH A GENERATOR

BACKGROUND OF THE INVENTION

1. Field of the Invention

The invention relates to a step waveform generator and in particular but not exclusively to a vertical timebase circuit for a raster-scanned cathode ray tube (CRT) incorporating such a circuit.

2. Description of the Prior Art

The advantages of a stepped vertical timebase for a CRT over the customary voltage ramp circuit are explained in the co-pending European Patent Application No. 82306865.5 (U.S. Ser. No. 537,776 filed 9/30/83). Briefly, when a CRT display employs voltage ramps to raster-scan the screen, problems arise due, for example, to variations in beam velocity during the scan, or variations in sync pulse frequency. Either of these irregularities can cause inconsistencies in scan line spacing over the face of the screen. For the same reasons inaccuracies are experienced when varying the display format for example to set a top margin for the display, or provide multiple line skips at selected locations on the screen. Furthermore, in interlaced displays variation in beam velocity or distortion of the ramp voltage by scan induced noise can cause the starting points for the interlaced field scans to be mispositioned leading to a visual phenomenon known as line pairing.

These problems are overcome by the use of a stepped voltage generator in place of the conventional ramp voltage generator. The output voltage level of the generator is increased by one step on receipt of each horizontal sync pulse and, provided the step height is accurately defined, the resulting line spacing is constant over the entire screen surface. Multiple line skips are accurately defined by controlling the generator to produce integral multiples of voltage steps as required. Finally, accurate interlace is achieved by providing a half step at the beginning of the stepped (or staircase) voltage waveform.

The stepped vertical timebase circuit described in the aforementioned European Patent Application includes a staircase generator which employs a so-called 'cup and bucket' circuit to generate the stepped output voltage waveform. In this circuit the charge on a bucket capacitor is incrementally increased by the repetitive addition of small constant amounts of charge supplied from a cup capacitor. The cup capacitor is itself charged by a predetermined amount in response to receipt of each horizontal sync pulse. The value of the charge is determined by a voltage, derived from a reference voltage circuit, and connected across the capacitor each time the horizontal sync pulse is generated during the scanning operation. At the termination of each sync pulse, the cup capacitor is discharged into the bucket capacitor. An operational amplifier connected to the bucket capacitor stabilizes the voltage on the bucket capacitor. A reset circuit responsive to the vertical or field sync pulse periodically discharges the bucket capacitor to zero so that the process starts again on each new field scan.

A disadvantage with the circuit employed in the aforesaid European application is that portions of the circuit, for example the reference voltage circuit, are temperature dependent and although the circuit is regarded as being perfectly adequate for most applications, under certain conditions it may not produce voltage steps of sufficiently close tolerance to assure a picture of high enough quality. Furthermore, while line skip and interlace can be achieved with this circuit, in practice difficult tolerancing problems may be experienced.

SUMMARY OF THE INVENTION

In the circuit subject of the present invention, use is made of an operational amplifier to control the charging and discharging of the cup capacitor in such a way that the value of its charge is temperature independent. By duplicating the cup capacitor discharge current using one or more current mirrors, the step height transferred to the bucket capacitor is also made temperature independent. Multiple line skip, top and interlace are all provided by using an appropriate combination of multiplying or dividing current mirrors feeding the bucket capacitor.

BRIEF DESCRIPTION OF THE DRAWINGS

In order that the invention may be fully understood, a preferred embodiment thereof will now be described with reference to the accompanying drawings, in which.

DETAILED DESCRIPTION

The operation of the circuit will be described in two parts. The first part will deal with the input section of the circuit including the charge and discharge of a cup capacitor in response to horizontal sync pulses supplied to the input of the circuit. The second part will deal with output section of the circuit including the incremental transfer of charge to a bucket capacitor in order to provide the required stepped waveform at the output of the circuit.

An input terminal 1 is connected to the base electrode of transistor T1 connected in series with resistor R1 between a supply voltage V STEP and ground. As the name implies, it is the value of this supply voltage that ultimately determines the magnitude of each incremental voltage step used to construct the stepped waveform supplied at the output of the circuit. A cup capacitor C1 has one electrode connected to the output of transistor T1 and the other to the anode of diode D1; the collector of transistor T2 (forming one limb of long-tail pair switching transistors T2 and T3); and the inverting input of operational amplifier 2. A current source I1 is connected in the tail of longtail pair transistor T2 and T3, the bases of which are interconnected by a diode D2. The biasing arrangement is such that transistor T2 is normally cut-off with the constant current I1 flowing through transistor T3.

The output from operational amplifier 2 is connected to the base of transistor T4 (one transistor of further long-tail pair switching transistors T4 and T5). A current source I2 is connected in the tail of long-tail pair transistors T4 and T5, the bases of which are interconnected by a diode D3. The biasing arrangement is such that transistor T4 is normally cut-off with the constant current I2 flowing through transistor T5. A feedback path is provided from the collector of transistor T4 via a current mirroring arrangement formed from pnp transistors T7 and T6 to the non-inverting input of operational amplifier 2.

Figure 2:
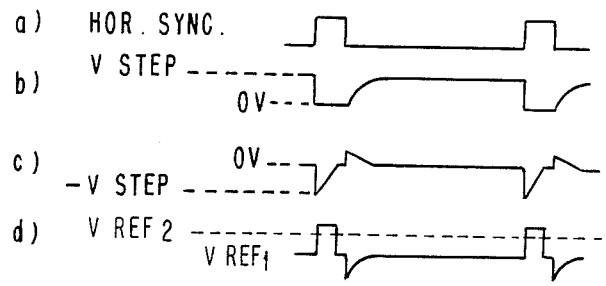
FIG. 2 shows voltage waveforms at various nodes in the circuit.

In operation, positive going horizontal sync pulses derived by the CRT scan mechanism (not shown) are supplied as input to the circuit at input terminal 1. Each sync pulse, shown as waveform (a) in FIG. 2, turns on transistor T1 and drives it into saturation. The voltage on the output of transistor T1, that is at node A, falls from V STEP to ground as shown by waveform (b) in FIG. 2. Initially, the voltage on the other side of capacitor C1, that is at node B, follows this excursion falling from ground to V STEP as shown in waveform (c) in FIG. 2. Diode D1 becomes reversed biased and the output from operational amplifier 2, that is node C, goes more positive than the voltage V REF 2 on the base of transistor T5, as shown by waveform (d), switching the long-tail pair transistors T4 and T5 and diverting the constant current I2 from transistor T5 to transistor T4. This constant current I2 is mirrored by transistors T7 and T6 and fed back to the non-inverting input of the amplifier to discharge the cup capacitor C1 and linearly to restore the voltage at node B to virtual ground.

Upon termination of the horizontal sync pulse when the input voltage is returned to ground, transistor T1 is cut-off and the charge restored in capacitor C1 initially through resistor R1 and diode D1. As node B goes positive, so node C is driven negative and constant current I1, normally flowing through transistor T3, is diverted through transistor T2. This continues until node B is restored to virtual ground at which time the collector current of transistor T2 will gradually reduce until capacitor C1 is completely charged. The input stage of the operational amplifier uses pnp transistors which require a small bias current to be drawn from the input pin. Hence the circuit settles with the amplifier input bias being supplied by transistor T2. By making V STEP large compared with any temperature variation in the saturation voltage of transistor T1 (a voltage of 1 volt is sufficient for V STEP) and by using characteristics of good temperature independence exhibited by current mirrors, the step height is well controlled. This process of discharging and charging the cup capacitor with a precisely controlled amount of charge is repeated for each input sync pulse.

Figure 1:
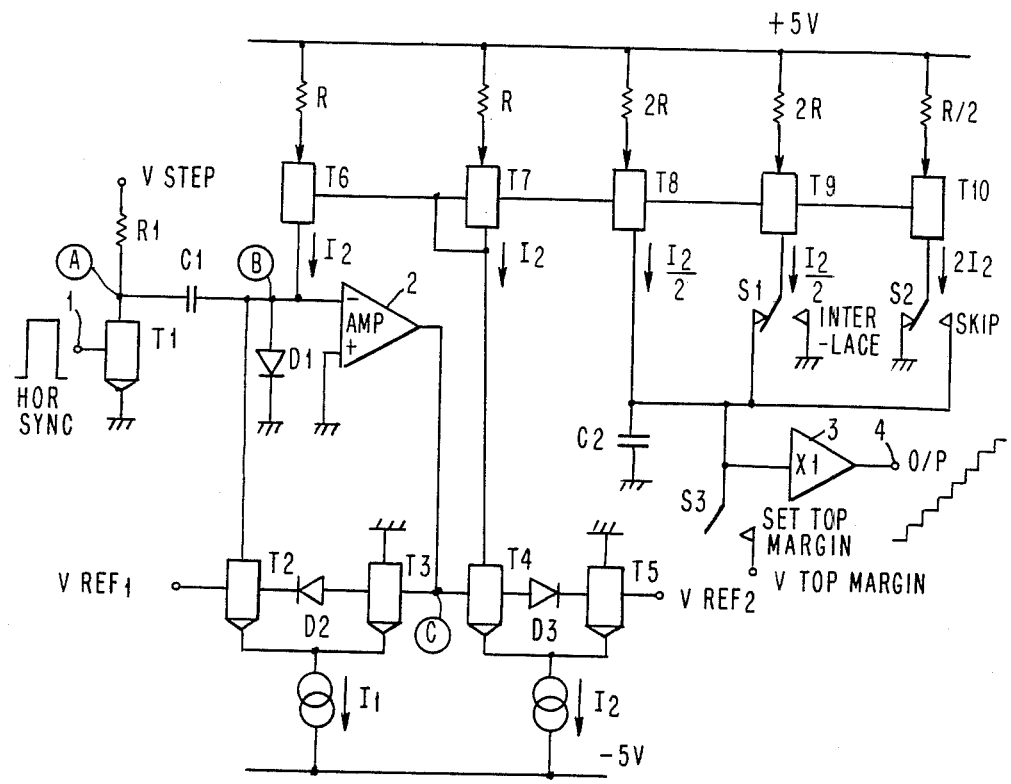
FIG. 1 shows a CRT vertical timebase incorporating a stepped waveform generator according to the invention.

The charging current I2 flowing in response to the occurrence of a horizontal sync pulse at the input 1 to the circuit is duplicated and added to bucket capacitor C2 by the combined effect of two current mirrors formed from pnp transistors T8 and T9 each with emitter resistances twice the resistive value of the emitter resistance of transistors T7 and T6. Each mirror therefore generates a charging current I2/2 for the bucket capacitor C2 in response to a charging current if I2 for cup capacitor C1. Normally, switch S1 is in the left-hand position as shown in FIG. 1 so that the full charging current I2 is duplicated in the bucket capacitor. The incrementally increasing voltage on the capacitor C2 is supplied as input to operational amplifier 3 with unity gain to provide the stepped output voltage waveform at output terminal 4.

For interlace displays, switch S1 is opened for one line scan at the start of alternate fields in order to divert the I2/2 current through transistor T9 and thereby provide a half step to the output voltage waveform.

A further current mirror formed from pnp transistor T10 with emitter resistance half the resistive value of the emitter resistance of transistor T7 generates a charging current 2I2 in response to a current I2 through transistor T7. Normally the current 2I2 is diverted to ground through switch S2 in its left-hand position as shown in FIG. 1. Where a three line skip is required however, the switch S2 is moved to its right hand position and the combined charging currents from transistors T8, T9 and T10 supplied to capacitor C2. Clearly this technique can be expanded by appropriate use of selected multiplying and dividing current mirrors to provide multiple field interlace and multiple line skips as required.

In order to set the top margin of the scan a voltage VTM of the appropriate magnitude is applied to the input of operational amplifier 3 through switch S3. Although in FIG. 1 only one value of VTM is shown, clearly other values could be supplied if different size of top margin spacing is required.

I claim:

1. A step waveform generator comprising a cup and bucket charge circuit in which a cup capacitor is alternately charged and discharged in response to each pulse of an input pulse train supplied thereto and increments of charge from said cup capacitor are transferred successively to a bucket capacitor where they are accumulated, characterized in that the circuit includes an operational amplifier connected to monitor voltage across the cup capacitor and operable in response to a voltage of one polarity to switch a first current source into a first feedback loop in order to discharge the cup capacitor or in response to a voltage of the opposite polarity to switch a second current source into a second feedback loop in order to charge the cup capacitor, independently of the charge on said bucket capacitor.

2. A step waveform generator as claimed in claim 1, in which charging (or discharging) currents providing each individual unit of charge are duplicated by a further current mirror arrangement to each duplicated current is used to add charge sequentially to the bucket capacitor.

3. A step waveform generator as claimed in claim 1 or claim 2, in which charging (or discharging) currents are supplied simultaneously to a predetermined combination of current mirrors, dividing mirrors, and multiplying mirrors, the output currents of which are selectively gated to provide charging current to the bucket capacitor having a magnitude equal to, or a multiple or submultiple of, the charging (or discharging) current of the cup capacitor from which it was derived.

4. A CRT vertical timebase circuit incorporating a step waveform generator as claimed in claim 1 or claim 2 operable in response to CRT horizontal sync pulses supplied thereto.

5. A CRT vertical timebase circuit incorporating a step waveform generator as claimed in claim 3 operable in response to CRT horizontal sync pulses supplied thereto.

* * * * *